(12) United States Patent
Friedrich et al.

(10) Patent No.: US 7,061,296 B2
(45) Date of Patent: Jun. 13, 2006

(54) CIRCUIT ARRANGEMENT FOR GENERATING A DIGITAL CLOCK SIGNAL

(75) Inventors: Martin Friedrich, Gelsenkirchen (DE);
Christian Grewing, Dusseldorf (DE);
Rashid Malik, Duisburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/818,928

(22) Filed: Apr. 5, 2004

(65) Prior Publication Data

US 2005/0134354 A1 Jun. 23, 2005

Related U.S. Application Data

(60) Provisional application No. 60/531,346, filed on Dec. 19, 2003.

(51) Int. Cl.
*G06F 1/04* (2006.01)
(52) U.S. Cl. .................. 327/299; 327/101; 327/115; 327/291
(58) Field of Classification Search ............... 327/101, 327/115, 126, 131, 134, 291, 299, 111, 143; 331/111, 143
See application file for complete search history.

(56) References Cited

U.S. PATENT DOCUMENTS

| | | | |
|---|---|---|---|
| 4,535,305 A * | 8/1985 | Matsuo et al. | 331/111 |
| 4,603,308 A * | 7/1986 | Briefer | 331/143 |
| 4,983,931 A * | 1/1991 | Nakano | 331/143 |
| 5,534,819 A * | 7/1996 | Gunter et al. | 327/553 |
| 6,020,792 A * | 2/2000 | Nolan et al. | 331/176 |
| 6,052,035 A * | 4/2000 | Nolan et al. | 331/111 |
| 6,069,536 A | 5/2000 | Oh | |
| 6,356,161 B1 * | 3/2002 | Nolan et al. | 331/74 |
| 6,741,114 B1 * | 5/2004 | Kim | 327/310 |
| 6,873,216 B1 * | 3/2005 | Seya | 331/74 |
| 2001/0026182 A1 * | 10/2001 | Brox | 327/261 |
| 2002/0044001 A1 * | 4/2002 | Matsui | 327/334 |
| 2002/0167348 A1 * | 11/2002 | Kim | 327/310 |

FOREIGN PATENT DOCUMENTS

EP 0 293 045 A1 11/1988

* cited by examiner

*Primary Examiner*—Kenneth B. Wells
*Assistant Examiner*—Khareem E. Almo
(74) *Attorney, Agent, or Firm*—Eschweiler & Associates, LLC

(57) ABSTRACT

A circuit arrangement for generating a digital clock signal which manages without a crystal oscillator and has a low current consumption. The circuit arrangement includes: a transistor circuit having a first, n-channel FET transistor and a second, p-channel FET transistor, which are connected in series, a comparator having a positive comparator input, a negative comparator input and a comparator output, a device for providing two switching thresholds to the negative input of the comparator, and a capacitance, which is alternately charged and discharged via the two FET transistors. The voltage present at the capacitance is fed to the positive comparator input, and the output voltage of the comparator, which represents a digital clock signal, is fed back to the input of the device for providing two switching thresholds and to the gate terminals of the first and second FET transistors.

18 Claims, 2 Drawing Sheets

CIRCUIT ARRANGEMENT FOR GENERATING A DIGITAL CLOCK SIGNAL

RELATED APPLICATION

The present application claims priority of U.S. Patent Application Ser. No. 60/531,346 filed by Martin Friedrich, Christian Grewing and Rashid Malik on Dec. 19, 2003.

FIELD OF THE INVENTION

The invention relates to a circuit arrangement for generating a digital clock signal. In particular, the invention relates to a circuit arrangement for generating a digital clock signal in the kHz range with very small currents in the µA range, which is employed e.g. in the sleep mode of an integrated circuit.

BACKGROUND OF THE INVENTION

In order to generate a digital clock signal, it is known to use crystal oscillators. Crystal oscillators are distinguished by a high frequency stability. A relatively high current consumption is disadvantageous, however.

SUMMARY OF THE INVENTION

The present invention provides a circuit arrangement for generating a digital clock signal which manages without a crystal oscillator. In this case, the circuit arrangement is intended to be distinguished by a low current consumption.

According to an embodiment of the invention, a circuit arrangement includes: a transistor circuit having a first, n-channel FET transistor and a second, p-channel FET transistor, which are connected in series, a comparator having a positive comparator input, a negative comparator input and a comparator output, a device for providing two switching thresholds, which, at its output, alternatively provides two switching thresholds for the comparator, the output of the device being connected to the negative input of the comparator, and a capacitance, which is alternately charged and discharged via the two FET transistors, the voltage present at the capacitance being fed to the positive comparator input. The output voltage of the comparator represents a digital clock signal, which is fed back to the input of the device for providing two switching thresholds and to the gate terminals of the first and second FET transistors.

The device for providing two switching thresholds, which is preferably an inverter, makes available at its output, depending on the input signal, one of two switching thresholds for the negative comparator input. The capacitance C is charged with a constant current via one of the FET transistors and is discharged with a constant current via the other of the FET transistors. The voltage of the capacitance which is present at the positive comparator input and the switching threshold which is present at the negative comparator input determine the state of the comparator output. The comparator is used as a voltage comparator and makes a digital clock signal available at its output. By using integrated components and dispensing with external components such as external crystal oscillators, it is possible to achieve a very low current consumption. This applies particularly to the case where the integrated components are embodied in CMOS technology.

In a preferred refinement of the invention, the circuit arrangement additionally has means for setting the frequency of the output signal of the comparator, said means influencing the voltage at the positive comparator input. In a preferred embodiment, said means is a device for controlling the current through the first FET transistor and the second FET transistor. In particular, the circuit arrangement has a first current source for providing a current for the first FET transistor and a second current source for providing a current through the second FET transistor, the device for controlling the current controlling the first current source and/or the second current source. Control in the sense of the present invention is in this case to be understood to mean both open-loop control (without feedback) and closed-loop control (with feedback).

The control of the current through the current sources of the FET transistors influences the charging and discharging operations of the capacitance, the voltage of which is fed to the positive comparator input. Accordingly, the frequency of the output signal of the comparator may be influenced or set by varying the currents or a control of the current sources.

In an alternative refinement, the means for setting the frequency are provided by a device for setting the capacitance. In this case, the capacitance preferably has a plurality of partial capacitances, which can be connected in parallel with one another by means of switches, the device for setting the capacitance connecting said partial capacitances in or out. In other words, the device for setting the capacitance is a Trim logic which connects partial capacitances in or out.

In the case of this variant of the invention, the frequency of the clock signal is influenced insofar as, in the case of a relatively large capacitance, the charging or discharging current provided by the two FET transistors leads to a slower voltage build-up or reduction, respectively, at the capacitance and thus at the positive comparator input. The frequency of the clock signal accordingly goes down. The frequency of the clock signal increases in a corresponding manner in the case of a reduction of the capacitance.

It may be provided that the device for setting the capacitance or the device for controlling the current—depending on which of these two possibilities is utilized for influencing the frequency of the clock signal—performs a comparison of the present frequency of the clock signal with a reference frequency at specific time intervals. The reference frequency is provided for example by an external crystal oscillator. However, since such an adjustment is only effected momentarily, the crystal oscillator can be switched off again after a corresponding adjustment, so that the additional crystal oscillator gives rise only to a low current consumption.

The currents through the first FET transistor and the second FET transistor are preferably identical in terms of magnitude. The capacitance is then charged or discharged by constant currents of equal magnitude. Furthermore, the first FET transistor and the second FET transistor are preferably designed in complementary fashion with respect to one another, which ensures that currents of identical magnitude are provided.

BRIEF DESCRIPTION OF THE DRAWINGS

The invention is explained in more detail below using an exemplary embodiment with reference to the figures, in which.

DESCRIPTION OF A PREFERRED EXEMPLARY EMBODIMENT

Figure 1:
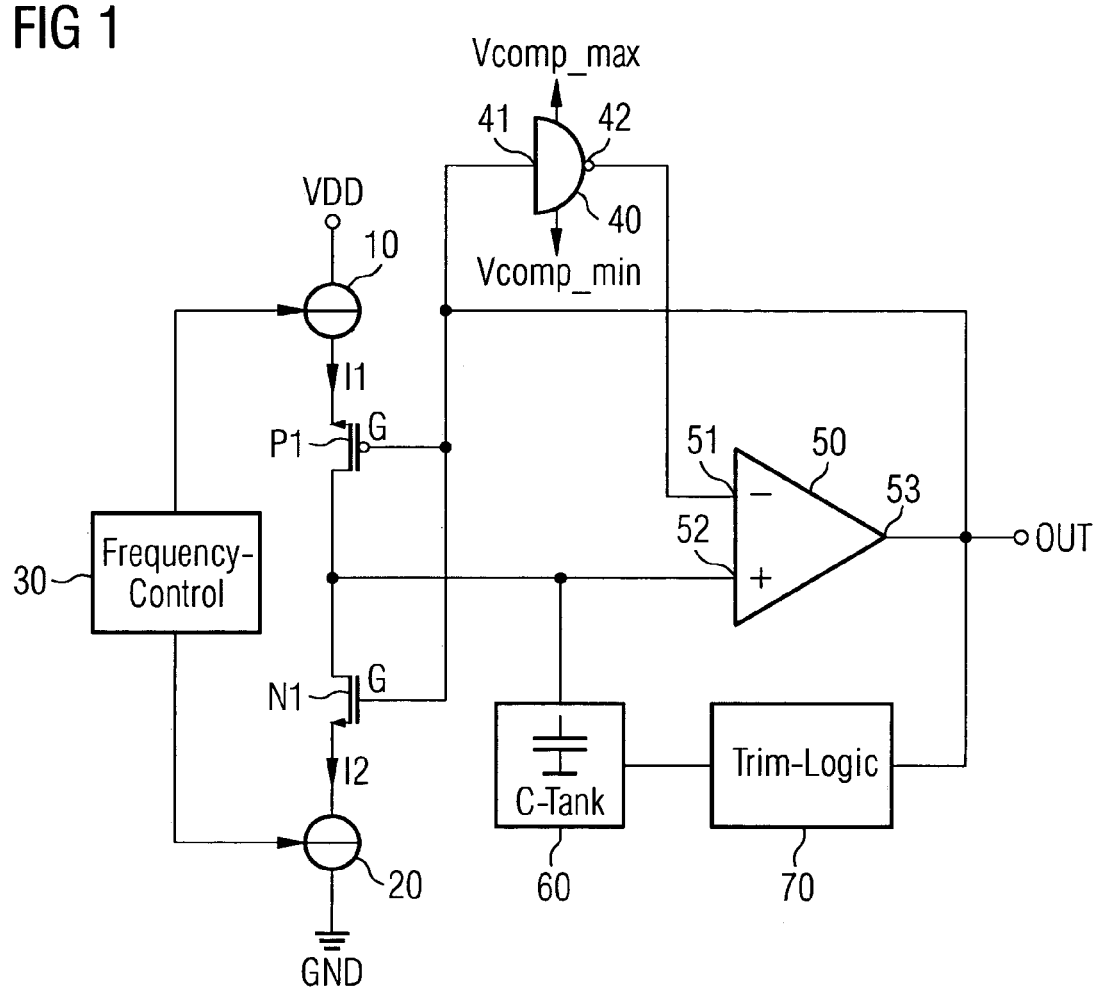
FIG. 1 shows a circuit arrangement for generating a digital clock signal.

The circuit arrangement of FIG. 1 has two switching transistors P1, N1, which are a P-channel FET transistor (field-effect transistor) P1 and an N-channel FET transistor N1. The two transistors P1, N1, and equally the further circuit parts of the circuit arrangement, are preferably embodied in CMOS technology.

The two switching transistors N1, P1 are connected in series with one another. The source terminal of the P-channel transistor P1 is connected to a supply voltage VDD via a first current source 10. The source terminal of the N-channel transistor N1 is connected to ground via a second current source 20. The drain terminals are connected on the one hand to one another and on the other hand to one terminal of a capacitance 60, which is also referred to as C tank below.

A comparator 50 is provided, which has a negative comparator input 51, a positive comparator input 52 and a comparator output 53. The positive comparator input 52 is connected to one terminal of the capacitance 60, so that the voltage present at the capacitance 60 determines the voltage at the positive comparator input 52. The negative comparator input 51 is connected to the output 42 of an inverter 40. The output 53 of the comparator can be tapped off as clock signal at a reference point OUT. Furthermore, the output of the comparator 53 is fed back on the one hand to the gate terminals of the switching transistors P1, N1 and on the other hand to the control input 41 of the inverter 40.

The inverter 40 comprises, for example, two series-connected N-channel and P-channel transistors, the gate voltages of which are determined by the voltage at the input 41. One of the transistors is connected to a voltage Vcomp-max, and the other of the transistors is connected to a voltage Vcomp-min. Depending on whether a HIGH signal or a LOW signal is present at the input 41 of the inverter 40, the voltage Vcomp-max or the voltage Vcomp-min is switched through to the output 42, while the respective other transistor is in the off state (CMOS inverter).

The voltages Vcomp-max and Vcomp-min make two switching thresholds available for the comparator 50, the inverter 40 making available at its output 42, depending on the input signal, either the voltage Vcomp-max or Vcomp-min as switching threshold.

The circuit arrangement furthermore has two optional devices 30, 70. One of these is a frequency control device 30, which enables a closed-loop control or open-loop control of the current sources 10, 20. As also explained, the output frequency of the oscillator can be set in current- or voltage-controlled fashion by means of a closed-loop control or open-loop control of the current sources 10, 20, if this is necessary. A further possibility for influencing the frequency of the clock signal is provided by a Trim logic 70, which can switch capacitances of the C tank in or out as required. The output frequency of the oscillator can be set by this means too. In this case, the accuracy of the frequency setting is given by the smallest capacitance value that can be realized in a technologically practical fashion.

Figure 3:
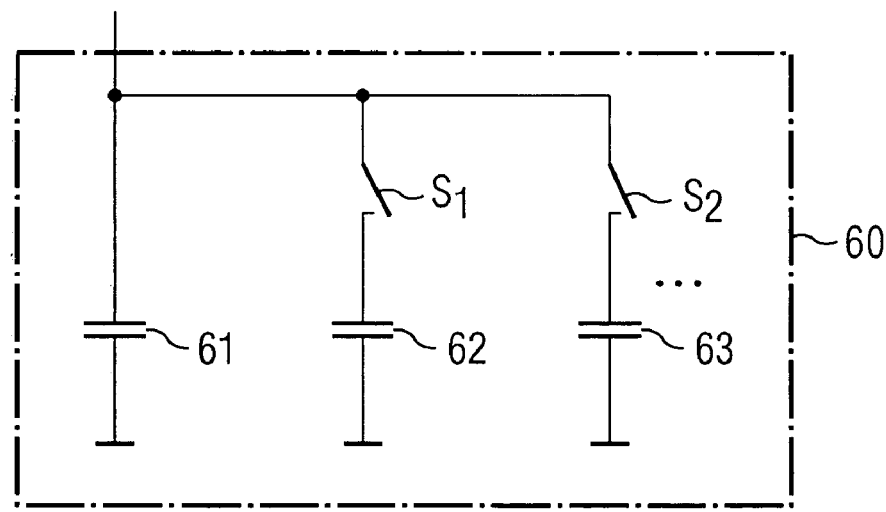
FIG. 3 shows a detailed illustration of the capacitance of the circuit arrangement of FIG. 1.

The influence of the Trim logic 70 on the C tank 60 is illustrated in greater detail with reference to FIG. 3. Accordingly, the C tank 60 comprises a plurality of partial capacitances 61, 62, 63. The capacitances 62, 63 can be connected in parallel with the capacitance 61 via switches S1, S2. In this case, switching is effected via the Trim logic 70, which performs a digital driving of the switches S1, S2.

The functioning of the circuit described is described below, reference being made supplementarily to FIG. 2. The significance of the optionally provided frequency control device 30 and Trim logic 70 will initially not be considered in this case.

Via the switching transistors N1, P1, the capacitance 60 is charged with a constant current I1 (with transistor P1 in the on state) or discharged with a constant current I2 of equal magnitude (with N-channel transistor N1 in the on state). In this case, the clock is prescribed by the output signal of the comparator 50, the output 53 of which is connected to the gate terminals of the transistors P1, N1. Consequently, a varying voltage is present at the capacitance 60, depending on the charge state. Said voltage is fed to the positive comparator input 52. The voltage at the negative comparator input 51 is provided by the inverter 40 one of the two values Vcomp-max and Vcomp-min alternately being provided. The voltage at the capacitance 60 which is present at the positive comparator input 52 and the voltage which is present at the negative comparator input 51 determine the state of the comparator output 53 and the state of the capacitance 60 according to the following table:

| Comparator input | Comparator output | Charge state C |
| --- | --- | --- |
| voltage+ > voltage− | HIGH | discharging (I2) |
| voltage+ < voltage− | LOW | charging (I1) |

If the voltage at the positive comparator input 52 is greater than the voltage at the negative comparator input 51, the signal "HIGH" is present at the output of the comparator 50. If the voltage at the positive comparator input 52 is less than the voltage at the negative comparator input 51, the voltage "LOW" is present at the comparator output. This respectively corresponds to a charging and discharging of the capacitance 60.

In order to ensure a reliable changeover of the comparator 50, the following condition must hold true for the switching thresholds Vcomp-max and Vcomp-min provided by the inverter 40: $V_{DD}$>Vcomp-max>Vcomp-min>$V_{SS}$. In this case, $V_{DD}$ represents the positive operating voltage and $V_{SS}$ the negative operating voltage, the latter generally being equal to ground.

Figure 2:
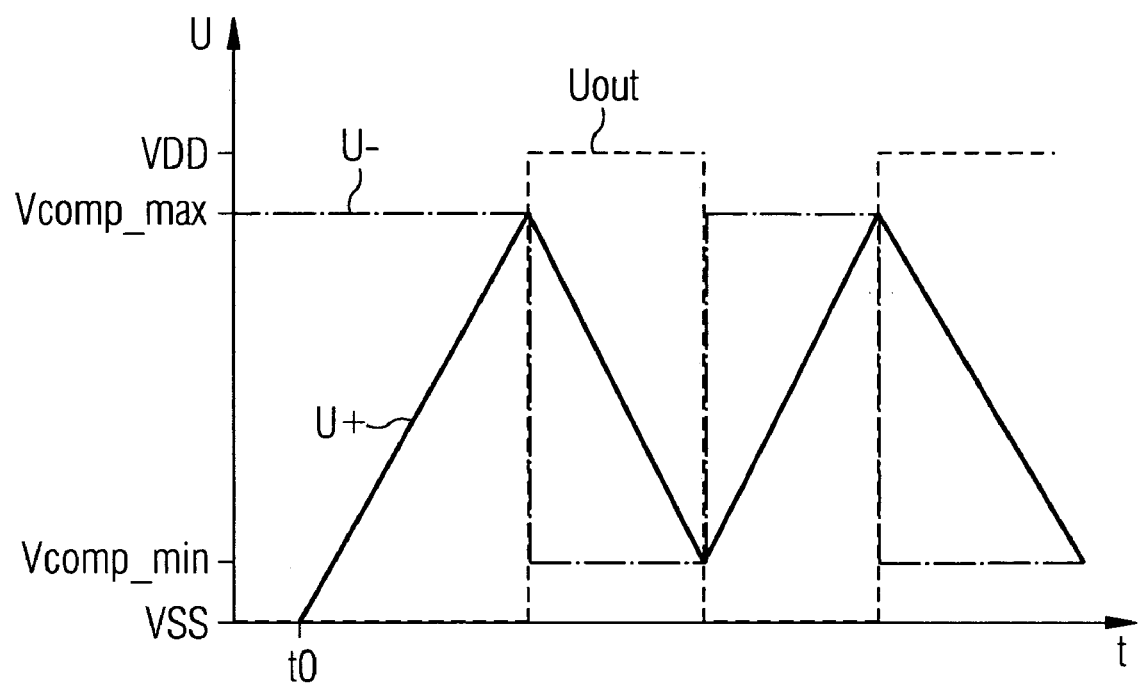
FIG. 2 shows the curve profile of the voltages at the positive comparator input, at the negative comparator input and at the comparator output of the comparator of the circuit arrangement of FIG. 1.

FIG. 2 shows by way of example the profile of the voltages at the comparator inputs 51, 52 and at the comparator output 53 as a function of time. The voltage at the negative comparator input is illustrated in dotted fashion and denoted by U−. The voltage at the positive comparator input is illustrated as a solid line and denoted by U+. The voltage at the comparator output is illustrated in dashed fashion and denoted by $U_{OUT}$.

At the instant t0, suppose that the capacitance 60 is completely discharged and the comparator output 53 is switched to "LOW". Thus, across the inverter 40, the value Vcomp-max is present as switching threshold at the negative comparator input 51. Since the comparator output 53 is switched to "LOW" the P-channel transistor P1 is furthermore in the on state, while the N-channel transistor N1 is in the off state. The capacitance 60 is then charged with the current I1 of the current source 10 via the P-channel transistor P1, which is in the ON state, until it holds true for the voltage at the positive comparator input 52 that said voltage is greater than Vcomp-max at the negative comparator input

51. The comparator 50 thereupon switches the output to logic "HIGH" i.e. $U_{out}$ equal to $V_{DD}$.

At the same time, the switching threshold at the output of the inverter 42 changes to Vcomp-min. Furthermore, at the same time the P-channel transistor P1 is turned off, while the N-channel transistor N1 is turned on. The capacitance 60 is thereupon discharged with the current I2 and the voltage at the capacitance 60 is thus reduced until the switching threshold Vcomp-min is undershot at the positive comparator input 52. If this occurs, the comparator switches to logic LOW, i.e. $U_{out}$ equal to $V_{SS}$, at the output and the sequence described starts anew.

It should also be mentioned that comparator 50, in accordance with the properties of a comparator, outputs the value $V_{DD}$ (logic HIGH) at the output 53 if the voltage at the negative comparator input 51 is less than the voltage at the positive comparator input 52. In the other case, the output voltage of the comparator 50 is at $V_{SS}$ (logic LOW). Depending on the logic family used, other output voltages may also be provided.

The circuit described thus makes a digital clock signal available at the output OUT. The clock frequency preferably lies in the kilohertz range, an example being 400 kHz. The current consumption preferably lies in the μA range, an example being approximately 40 μA. The components, as already mentioned, are preferably embodied in CMOS technology. The currents I1, I2 through the transistors P1, N1 are generated for example from a buffered bandgap reference by means of current mirrors. The switching thresholds Vcomp-max and Vcomp-min are generated from the same reference, for example by means of a high-impedance voltage divider.

The possibility of frequency setting by means of the frequency control device 30 and the Trim logic 70 will now be discussed. The frequency control device 30 can effect open-loop or closed-loop control of the current I1, I2 through the current sources 10, 20. Through a change in the current I1, I2, the capacitor 60 is charged or discharged differently. This leads to different time profiles until the switching threshold Vcomp-max or Vcomp-min is reached at the positive comparator input 52. The output frequency of the comparator 50 changes accordingly.

A comparable effect may also be achieved by means of the Trim logic 70, which, as explained with reference to FIG. 3, connects partial capacitances 61, 62, 63 of the C tank 60 in or out. The magnitude of the capacitance influences the time taken to reach the voltage Vcomp-max–Vcomp-min given a constant charging or discharging current I1, I2 at the positive comparator input 52, said voltage being present as switching threshold at the negative comparator input 51. Accordingly, the output frequency can also be influenced by capacitances being connected in or out.

As already mentioned, the frequency control device 30 and the Trim logic 70 are optional. It is also optionally possible for both to be used in combination.

In a further refinement of the circuit arrangement, the frequency control device 30 and/or the Trim logic 70 can be coupled to an external resonator, in particular a crystal oscillator. However, the external oscillator is switched on only at specific time intervals. It then serves to provide a reference value for a desired output frequency. In this case, the frequency control device 30 and/or the Trim logic 70 compares the present frequency of the clock signal with a desired comparison frequency provided by the external resonator and, if appropriate, changes the frequency in order to achieve correspondence. The external resonator is then switched off again, with the result that the current consumption of the external resonator is low.

The configuration of the invention is not restricted to the exemplary embodiment presented above. By way of example, the individual components may belong to a different logic family than CMOS. Moreover, by way of example, the switching thresholds Vcomp-max, Vcomp-min may also be provided by different circuit means than an inverter.

We claim:

1. A circuit arrangement for generating a digital clock signal, the circuit arrangement comprising:
   a transistor circuit including a first, n-channel FET transistor and a second, p-channel FET transistor, which are connected in series,
   a comparator including a positive comparator input, a negative comparator input and a comparator output,
   a device for providing two switching thresholds, which, at its output, alternatively provides the two switching thresholds to the negative input of the comparator,
   a capacitance, which is alternately charged and discharged via the two FET transistors, the voltage present at the capacitance being fed to the positive comparator input,
   means for setting a frequency of the digital clock signal generated by the comparator by influencing the voltage at the positive comparator input,
   wherein an output signal generated at the output terminal of the comparator represents a digital clock signal, which is fed back to the input of the device for providing two switching thresholds and to the gate terminals of the first and second FET transistors,
   wherein the means for setting the frequency comprises a device for controlling currents respectively passing through the first FET transistor and the second FET transistor, and
   wherein the device for controlling currents includes means for controlling the first FET transistor and the second FET transistor such that the capacitance is continuously charged discharged via the first FET transistor and the second FET transistor.

2. The circuit arrangement as claimed in claim 1, further comprising:
   a first current source for providing a current for the first FET transistor, and
   a second current source for providing a current through the second FET transistor,
   wherein the device for controlling the currents comprises means for controlling the first current source and the second current source.

3. The circuit arrangement as claimed in claim 1, wherein the means for setting the frequency further comprises a device for setting a magnitude of the capacitance.

4. The circuit arrangement as claimed in claim 3, wherein the capacitance comprises a plurality of partial capacitances and a plurality of switches for selectively connecting the partial capacitances in parallel with one another, and wherein the device for setting the magnitude of the capacitance controls the plurality of switches to connect the partial capacitances according to a selected frequency.

5. The circuit arrangement as claimed in claim 3, wherein the device for setting the magnitude of the capacitance comprises means for performing a comparison of a present frequency of the digital clock signal with a reference frequency at predetermined time intervals.

6. The circuit arrangement as claimed in claim 1, wherein the device for controlling the currents through the first FET transistor and the second FET transistor comprises means for performing a comparison of a present frequency of the digital clock signal with a reference frequency at predetermined time intervals.

7. The circuit arrangement as claimed in claim 1, wherein the currents through the first FET transistor and the second FET transistor have identical magnitudes.

8. The circuit arrangement as claimed in claim 1, wherein the first FET transistor and the second FET transistor are designed in complementary fashion with respect to one another.

9. The circuit arrangement as claimed in claim 1, wherein the device for providing two switching thresholds comprises an inverter, whose input is clocked by the digital clock signal.

10. The circuit arrangement as claimed in claim 1, wherein the individual components being embodied in CMOS technology.

11. A digital clock circuit comprising:
a comparator having a first input terminal, a second input terminal, and an output terminal;
an inverter having an input terminal connected to the output terminal of the comparator and an output terminal connected to the first input terminal of the comparator;
a p-channel field-effect transistor (FET) having a first terminal coupled to a first voltage source, a second terminal connected to the second input terminal of the comparator, and a gate terminal connected to the output terminal of the comparator;
an n-channel field-effect transistor (FET) having a first terminal coupled to a second voltage source, a second terminal connected to the second input terminal of the comparator, and a gate terminal connected to the output terminal of the comparator;
a capacitance circuit connected to the second input terminal of the comparator; and
means for controlling currents respectively passing through the p-channel FET and the n-channel FET such that the capacitance circuit is continuously charged discharged via the p-channel FET and the n-channel FET.

12. The digital clock circuit according to claim 11, wherein the comparator comprises an operational amplifier, the first input terminal comprises an inverting input of the operational amplifier, and the second terminal comprises a non-inverting input of the operational amplifier.

13. The digital clock circuit according to claim 11, wherein the inverter comprises a p-channel transistor connected in series with an n-channel transistor between a high voltage source and a low voltage source, wherein the gate terminals of the p-channel transistor and the n-channel transistors are connected to the output terminal of the comparator.

14. The digital clock circuit according to claim 11, wherein the means for controlling currents comprises:
a first current source connected between the first voltage source and the first terminal of the p-channel FET; and
a second current source connected between the second voltage source and the first terminal of the n-channel FET.

15. The digital clock circuit according to claim 14, further comprising means for comparing a frequency of a digital clock signal generated an the output terminal of the comparator with a reference frequency, and f or controlling at least one of a capacitance magnitude of the capacitance circuit, a current magnitude of the first current source, and a current magnitude of the second current source such that the digital clock signal frequency is equal to the reference frequency.

16. The digital clock circuit according to claim 11, wherein the capacitance circuit comprises:
a first capacitor connected between the second input terminal of the comparator and the second voltage source;
a second capacitor having a first terminal connected to the second voltage source and a second terminal; and
a switch connected between the second terminal of the second capacitor and the second input terminal of the comparator.

17. The digital clock circuit according to claim 16, further comprising means for comparing a frequency of a digital clock signal generated an the output terminal of the comparator with a reference frequency, and for controlling the switch to change a capacitance magnitude of the capacitance circuit such that the digital clock signal frequency is equal to the reference frequency.

18. The digital clock circuit according to claim 16, further comprising a CMOS element including the p-channel FET and the n-channel FET.

* * * * *

UNITED STATES PATENT AND TRADEMARK OFFICE
CERTIFICATE OF CORRECTION

| | | |
|---|---|---|
| PATENT NO. | : 7,061,296 B2 | Page 1 of 1 |
| APPLICATION NO. | : 10/818928 | |
| DATED | : June 13, 2006 | |
| INVENTOR(S) | : Martin Friedrich et al. | |

It is certified that error appears in the above-identified patent and that said Letters Patent is hereby corrected as shown below:

Column 8, Line 17, Claim 15, delete "an" and insert -- and --;

Column 8, Line 18, Claim 15, delete "f or" and insert -- for --;

Column 8, Line 37, Claim 17, delete "an" and insert -- and --.

Signed and Sealed this

Twenty-sixth Day of October, 2010

David J. Kappos
*Director of the United States Patent and Trademark Office*